United States Patent [19]
Kasai

[11] Patent Number: 4,951,117
[45] Date of Patent: Aug. 21, 1990

[54] ISOLATION OF INSULATED-GATE FIELD-EFFECT TRANSISTORS

[75] Inventor: Naoki Kasai, Tokyo, Japan

[73] Assignee: NEC Corporation, Tokyo, Japan

[21] Appl. No.: 234,358

[22] Filed: Aug. 19, 1988

[30] Foreign Application Priority Data

Aug. 21, 1987 [JP] Japan .............................. 62-208723

[51] Int. Cl.$^5$ ............................................ H01L 27/12
[52] U.S. Cl. .................................... 357/49; 357/23.4; 357/42
[58] Field of Search .................. 357/49, 23.4, 23.1, 357/54, 55, 23.14, 42, 46

[56] References Cited

U.S. PATENT DOCUMENTS 4,570,330 2/1986 Cogan .................................. 357/49
4,661,202 4/1987 Ochii .................................... 357/42

FOREIGN PATENT DOCUMENTS 61-220465 9/1986 Japan .................................... 357/49

OTHER PUBLICATIONS

Kasai et al., "$\frac{1}{2}\mu$m CMOS Isolation Technque Using Selective Epitaxy", IEEE, vol. Ed-34, No. 6, Jun. 1987.

Primary Examiner—Rolf Hille
Assistant Examiner—Minh Loan Tran
Attorney, Agent, or Firm—Helfgott & Karas

[57] ABSTRACT

A semiconductor device and a method of fabricating the same wherein a semiconductor substrate of one conductivity type is formed of three laterally arrayed portions by providing two trenches in the substrate and filling them with first and second epitaxial layers of an opposite conductivity type. A buried layer of the opposite conductivity type is formed within the substrate. First and second insulator films are provided on the side walls of both trenches. The first portion of the substrate has a first region of one conductivity type. A second region of the one conductivity type is buried within the substrate. A third region of the opposite conductivity type is interposed in the direction of substrate depth between the first and second insulator films. The portion of the substrate includes a fourth region isolated from the first to third regions by the first insulator film. The third portion of the substrate includes a fifth region of the one conductivity type electrically connected to the second region. The first, second and fourth region work as one and the other of drain and source regions, and the gate of a vertical MOS transistor, respectively, and the fifth region is used for electrical connection to the buried second region.

5 Claims, 3 Drawing Sheets

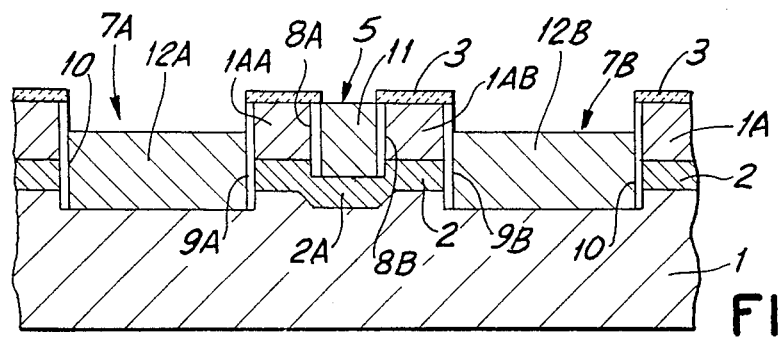

ISOLATION OF INSULATED-GATE FIELD-EFFECT TRANSISTORS

BACKGROUND OF THE INVENTION

This invention relates to isolation of insulated-gate field effect transistors (hereinafter referred to as MOS transistors) and more particularly to isolation of complementary MOS (hereinafter referred to as CMOS) transistors formed on a substrate in a high density.

Integrated circuit devices using CMOS transistors are featured in low power consumption and high noise margin. Higher integration density of CMOS devices has been attained in recent years and a large number of proposals have been made on the isolation structure of CMOS ULSI devices. Kasai et al. have disclosed such isolation structure in their article "¼µm CMOS Isolation Technique Using Selective Epitaxy"(IEEE TRANSACTIONS ON ELECTRON DEVICES, Vol. ED-34, No. 6, Jun. 1987, pp. 1331-1336). The disclosed technique comprises forming a trench in a p-type silicon substrate, forming ¼µm thick insulator films for device isolation on the sidewalls of the trench, which are shaped perpendicular to the substrate surface plane, refilling the trench with selectively grown single-crystal silicon thereby to provide an n-well, and fabricating a n-channel MOS transitor on the p-type substrate and a p-channel MOS transistor on the n-well.

In the prior art technique described above, the device isolation region can be made narrow by reducing the thickness of the insulator film formed on the trench sidewall without relying on resolution of the lithography process. However, the MOS transistors fabricated are of the conventional planar type and it has been difficult to reduce the occupying area of the MOS transistors.

SUMMARY OF THE INVENTION

It is therefore an object of the present invention to provide an isolation structure of MOS transistors in which the occupying area of at least a part of the MOS transistors is reduced.

It is another object of the present invention to provide a CMOS device in a higher density.

The present invention is characterized by using the isolation insulator film on the trench sidewall as a gate insulation film of a vertical MOS transistor.

In more particular, the present invention comprises a semiconductor substrate and a first and a second thin insulator films separately projected from the surface of the substrate down into the substrate, a second thin insulator film being shallower than the first thin insulator film, a first portion of the substrate interposed between the first and second thin insulator films having a first region of one conductivity type at the upper surface thereof, a second region of the one conductivity type buried within the substrate and extending more deeply than the second insulator film and more shallowly than the first insulator film, and a third region of the opposite conductivity type interposed in the depth wise direction between the first and second regions and in the lateral direction between the first and second insulator films. The substrate further has a second portion adjacent to the first insulator film which includes a fourth region facing the third region via the first insulator film and isolated from the first to third regions by the first insulator film and a third portion adjacent to the second insulator film which includes a fifth region of the one conductivity type electrically connected to the second region via under the lower edge of the second insulator film and essentially isolated from the first region by the second insulator film. The first, second and fourth region work as one and the other of drain and source, regions and the gate of a vertical MOS transistor, respectively, and the fifth region is used for electrical connection to the buried second region. The first and second insulator films may be sidewall insulator films of a first and second trenches, respectively, and the second and third portions of the substrate may be epitaxial layers refilling the first and second trenches, respectively. In that case, the second region deeply embedded in the substrate and the first region formed at the surface of the substrate serve as the source and drain of the MOS transistor and the insulator film formed on the sidewall of the first trench serves as the gate insulator. Furthermore, the fourth region may be a drain or source of a lateral MOS transistor formed on the epitaxial layer deposited within the first trench. The fourth region is formed in such a manner as to face or overlap the third region interposed by the first and second regions and formed in the first portion of the substrate. A first conductivity type channel MOS transistor of a vertical structure may have the drain or source of the opposite conductivity type channel MOS transistor of the lateral structure as the gate electrode.

Another aspect of the present invention provides a method of fabricating a CMOS integrated circuit, which comprises the steps of forming, within a semiconductor substrate of one conductivity type, a buried layer of the opposite conductivity type, forming a first trench in a desired region of the semiconductor substrate in such a manner as to reach the buried layer, forming a second trench deeper than the first trench in the semi-conductor substrate to penetrate the buried layer, forming insulator films on the sidewalls of the first and second trenches, filling the first and second trenches with epitaxial layers of the opposite conductivity type in a desired thickness, forming a region of the opposite conductivity type at the surface of such a portion of the semiconductor substrate of the one conductivity type that is interposed between the first and second trenches, and forming an MOS field effect transistor of the one conductivity type channel on the surface of the epitaxial layer of the opposite conductivity type filling the second trench.

BRIEF DESCRIPTION OF THE DRAWINGS

FIGS. 1 through 6 are schematic cross-sectional views in respective fabrication steps of a CMOS device according to an embodiment of the present invention.

FIG. 7 is a circuit diagram of a CMOS flip-flop circuit realized by the CMOS device shown in FIG. 6.

DETAILED DESCRIPTION OF PREFERRED EMBODIMENT

Figure 1:
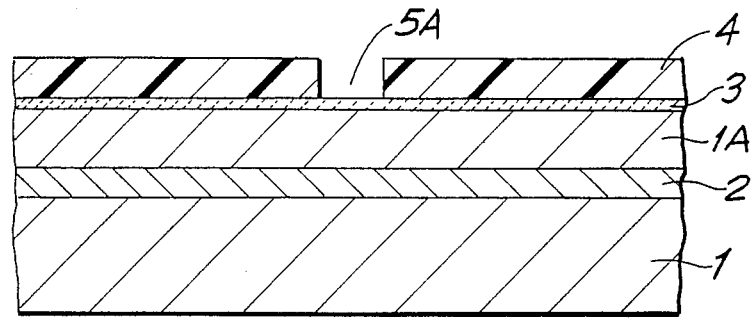

Referring to FIG. 1, and (100) oriented p-type silicon substrate 1 with 1-Ω-cm resistively is subjected to ion implantation to form an n-type buried layer 2 therein at a depth of 0.5 to 0.8 µm from the surface thereof and then a 1,000 Å-thick $Si_3N_4$ film 3 is deposited on the surface portion 1A of the substrate by the CVD technique. A photo-resist film 4 is coated over the silicon nitride film 3 and an opening 5A is formed therein by photolithography.

Figure 2:
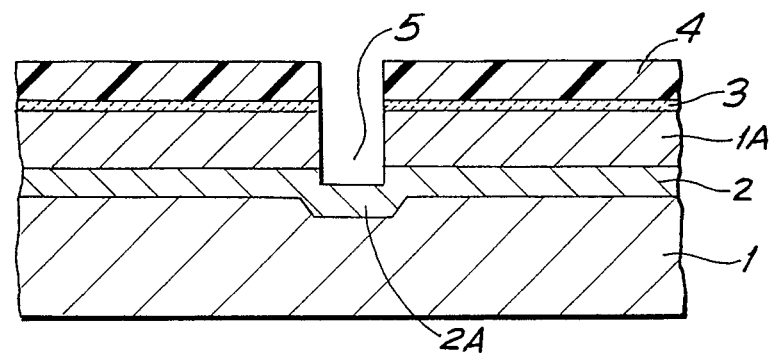

Referring to FIG. 2, the silicon nitride film 3 and then the surface portion 1A of the substrate 1 are selectively etched by reactive in etching (RIE) with SiCl$_4$ gas through the opening 5A of the resist film 4 to form a first trench 5 having a depth of about 0.7 μm from the surface of the surface portion 1A of the substrate. The first trench 5 preferably reaches the n-type buried layer 2, penetrating the surface portion 1A of the substrate, and should not penetrate the buried layer 2. An additional n-type region 2A is formed under the bottom of the first trench 5 by ion implantation through the bottom of the first trench 5 to make it sure that the n-type bottom of the first trench 5 is electrically connected to the n-type buried layer 2. Thereafter, the photo-resist film 4 is removed.

Figure 3:
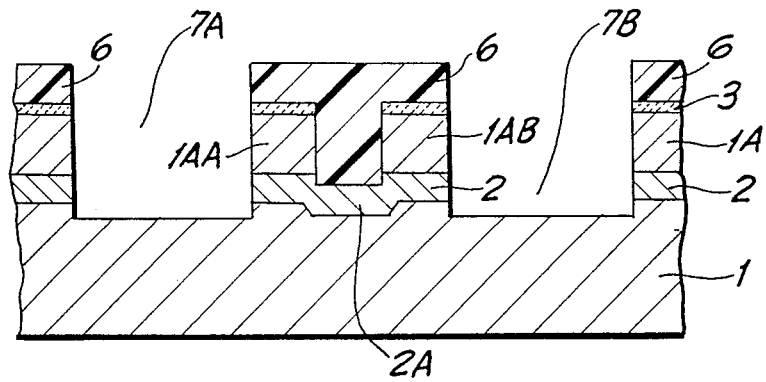
Figure 8:
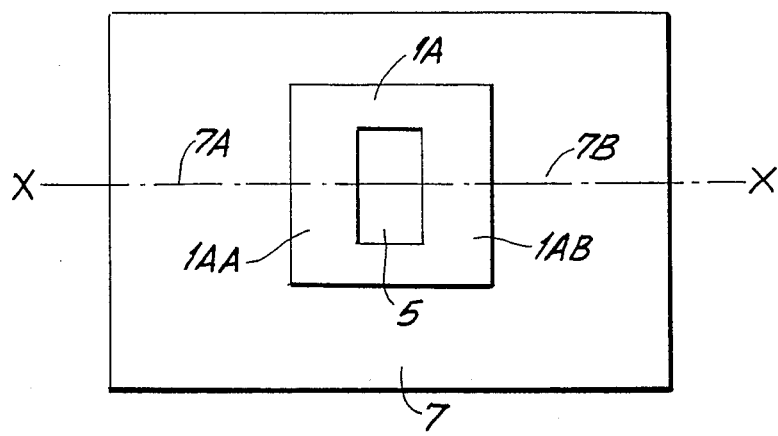
FIGS. 8 and 9 are schematic plan views in the fabrication steps corresponding to FIGS. 3 and 5, respectively, of the CMOS device of the embodiment.

Referring to FIGS. 3 and 8, the resultant surface is again coated with another photo-resist film 6 (not shown in FIG. 8) which is then treated to have an opening at the area where a second trench is to be formed. The silicon nitride film 3 and then the surface portion 1A of the substrate 1 and the n-type buried layer are selectively etched by RIE with the resist film 6 being used as a mask to form a second trench 7 having a depth of about 1.0 μm from the surface of the surface portion 1A. The second trench should completely penetrate the surface portion 1A and the n-type buried layer 2. Thus, the surface portion 1A and the n-type buried layer 2 assumed the first trench 5 are isolated from those outside the second trench 7. Moreover, the isolated surface portion 1A has a first region 1AA interposed between the first trench 5 and a first portion 7A of the second trench 7 and a second region 1AB interposed between the first shallow trench 5 and a second portion 7B of the second deep trench 7. FIG. 3 shows a cross section along a line X—X of FIG. 8 from which the photo-resist film 6 and the silicon nitride film 3 are omitted.

Thereafter, the photo-resist film 6 is removed and the exposed inner surfaces (i.e., vertical side walls and bottom faces) of the first and second trenches 5 and 7 are oxidized to form oxide films of about 300 Å in thickness. The upper surface of the remaining surface portion 1A of the substrate 1 is still covered with the silicon nitride film 3 and hence, not oxidized. The grown oxide films on the bottoms of the trenches 5 and 7 are removed by RIE technique, only 300 Å-thick insulator films 8, 9 and 10 remaining on the vertical sidewalls of the trenches 5 and 7 (see FIGS. 4 and 9).

Figure 9:
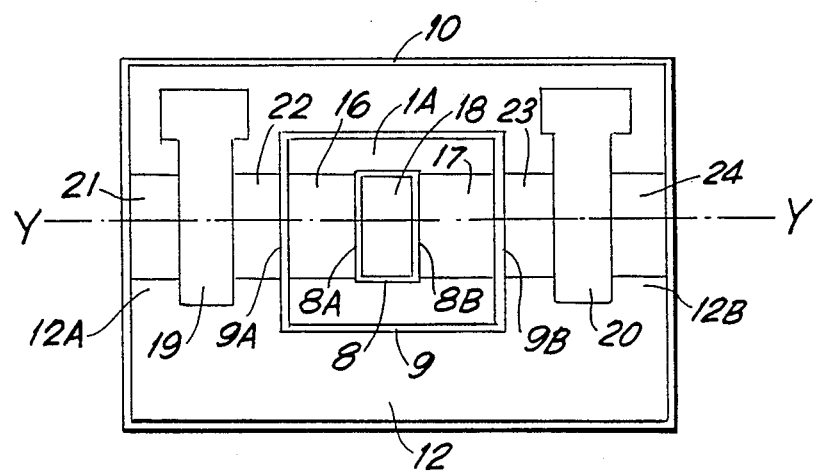

Further referring to FIGS. 4 and 9, n-type monocrystalline silicon is selectively grown on the exposed bottom surfaces of the trenches 5 and 7 (i.e., the exposed surfaces of the n-type buried layer 2 and of the p-type substrate 1, respectively) to a thickness of 0.7 μm to form n-type epitaxial layers 11 and 12 in the first and second trenches 5 and 7, respectively. The selective epitaxial growth is carried out of CVD technique at 950° C. under a reduced pressure of 50 torr, using a SiH$_2$Cl$_2$-HCl-H$_2$ gas system. The n-type layer 12 grown in the second trench 7 is used as an n-well. Its first portion 12A in the first portion 7A of the second trench faces the first region 1AA of the p-type surface portion via a first portion 9A of the sidewall insulator film 9 and a second portion 12B of the n-well 12 in the second portion 7B of the second trench 7 is adjacent to the second region 1AB of the p-type surface portion with a second portion 9B of the sidewall insulator 9 interposed therebetween. The n-type layer 11 fills the first trench 5 and faces the first and second p-type regions 1AA and 1AB via a first and second portions 8A and 8B, respectively, of the sidewall insulator 8. The silicon nitride film 3 is then removed.

Referring to FIGS. 5 and 9, an about 300 Å-thick gate insulator films 14 and 15 are formed on the first and second n-well portions 12A and 12B, respectively, and first and second polycrystalline silicon gate electrodes 19 and 20 are formed on the gate insulator films 14 and 15, respectively. Implantation of p-type ions is then carried out to the first and second n-well portions 12A and 12B with the first and second gate electrodes 19 and 20 serving as a mask to form high-concentration p-type source and drain regions 21, 22, 23 and 24. On the other hand, an insulator film 13 is formed over the upper surfaces of the island-like p-type surface portion 1A and the n-type epitaxial layer 11 in the first trench 5 and high-concentration n-type regions 16, 17 and 18 are selectively formed at the surfaces of the first and second p-type regions 1AA and 1AB and the n-type epitaxial layer 11, respectively. The n-type region 18 serves as a contact region for electrical connection to the isolated n-type buried layer 2 via the additional n-type region 2A and the n-type epitaxial layer 11 in the first trench. The other n-type regions 16 and 17 are separately formed only in the first and second p-type regions 1AA and 1AB, respectively, and work as source or drain regions of vertical MOS transistors. They are isolated from each other by the remaining regions of the p-type surface portion 1A. The n-type source of drain regions 16 and 17 are also isolated from the n-type region 18, or eventually from the n-type buried layer 2 which acts as drain or source regions of the vertical MOS transistors, by the first and second portions 8A and 8B of the sidewall insulator film 8. The depth of the n-type regions 16 and 17 are so selected that the first and second p-type regions 1AA and 1AB remain with a desired thickness which corresponds to a channel length of the vertical MOS transistors. The sidewalls of the p-type drain regions 22 and 23 of lateral MOS transistors face the remaining first and second p-type regions 1AA and 1AB, respectively, via the first and second portions 9A and 9B of the sidewall insulator film 9 which act as gate insulator films of the vertical MOS transistors. Thus, the drain regions 22 and 23 act as gate electrodes of the vertical MOS transistor. Accordingly, the depth of the p-type drain regions 22 and 23 should be so selected that the p-type regions 22 and 23 overlap in the depthwise direction the p-type regions 1AA and 1AB, respectively. Since the second trench 7 is deeper than the first trench 5 and the n-type epitaxial layers 12 and 11 are grown to the same height, the surface of the p-type regions 22 and 23 is lower than that of the n-type regions 16 and 17. This contributes to a low parasitic capacitance between the gate and the source or drain of the vertical MOS transistors, because undesireable over-lapping of the p-type region 22 (or 23) and the n-type region 16 (or 17) is avoided. FIG. 5 shows a cross section along the line Y—Y of FIG. 9.

As shown in FIG. 6, a surface passivation film 50 is then deposited over the surface of the structure of FIG. 5 and contact holes are opened through the surface passivation film 50 and the insulator film 14 or 13, followed by formation of aluminum electrodes 61, 62, 63, 64, 65, 66, 67, 68 and 69 which are contacted through the respective contact holes to the source and drain regions 21 and 22 and the gate 19 of a lateral p-channel MOS transistor Q$_1$, the source and drain regions 24 and 23 and the gate 20 of another lateral p-channel MOS transistor $Q_2$, the source regions 16 and 17 of the vertical n-channel MOS transistors $Q_4$ and $Q_3$ and the drain contact region 18 of the vertical transistors $Q_4$ and $Q_3$, respectively. In the present embodiment, the aluminum electrodes 61 through 69 are interconnected to form a CMOS flip-flop circuit as shown in FIG. 7. Referring to FIGS. 6 and 7, the electrodes 61 and 64 (the p-type source regions 21 and 24 of the lateral n-channel MOS transistors $Q_1$ and $Q_2$) are connected to a power source $V_{DD}$ and the electrode 69 is connected to the ground GND to ground the n-type common drain region 2 (the buried layer) of the vertical p-channel transistors $Q_3$ and $Q_4$. The electrodes 62 (i.e., the p-type drain region 22 of the p-channel transistor $Q_1$ and at the same time, the gate of the n-channel vertical transistor $Q_4$), the electrode 66 (i.e., the gate electrode 20 of the p-channel transistor $Q_2$) and the electrode 68 (i.e., the source region 17 of the n-channel transistor $Q_3$) are connected in common to a data input/output node D. The electrodes 63, 65 and 67 are commonly connected to the other data input/output node $\overline{D}$. In other words, the gate 19 of the p-channel transistor $Q_1$, the drain 23 of the other p-channel transistor $Q_2$ which is at the same time the gate of the n-channel transistor $Q_3$, and the source 16 of the other n-channel transistor $Q_4$ are connected to the node $\overline{D}$.

In the embodiment described above, the n-type epitaxial well 12 is formed in the p-type semiconductor substrate to form the vertical n-channel MOS transistors and the lateral p-channel MOS transistors. However, the present invention is not particularly limited thereto, and it is possible to use an n-type semiconductor substrate and a p-type epitaxial well to form vertical p-channel MOS transistors and lateral n-channel MOS transistors. Furthermore, though the sidewall insulator film is about 300 Å thick in the embodiment, the thickness is not limited thereto. In the embodiment, the n-type substrate regions of the p-channel transistors $Q_1$ and $Q_2$, that are the first and second portions 12A and 12B of the n-type epitaxial wall 12, are connected in common by the remaining portion of the n-type well 12, and the p-type substrate regions 1AA and 1AB of the n-channel transistors $Q_4$ and $Q_3$ are commonly connected by way of the remaining region of the p-type surface portion 1A. However, the n-type well regions 12A and 12B may be connected in a different way, and the p-type substrate regions 1AA and 1AB may be coupled in other known manners.

In accordance with the present invention, the insulator film formed on the trench sidewall is used for device isolation and as the gate insulator film of the vertical MOS transistor. Accordingly, the present invention reduces the occupying area of the device, and high packing density can be accomplished.

I claim:

1. A semiconductor device comprising a semiconductor substrate having a first portion, a second portion and a third portion arrayed therein laterally and adjacently in this order, a first thin insulator film projecting from a surface of said substrate down into said substrate and interposed between said first portion and said second portion of said substrate, a second thin insulator film projecting from the surface of said substrate down into said substrate more deeply than said first thin insulator film and interposed between said second portion and said third portion of said substrate, a first region of one conductivity type formed at the upper surface of said second portion of said substrate and extending laterally between said first and second thin insulator films a second region of said one conductivity type buried within said second portion of said substrate under said first region and extending in the depthwise direction more deeply than said first thin insulator film and more shallowly than said second thin insulator film, a third region of the opposite conductivity type formed in said second portion of said substrate and interposed in the depthwise direction between said first region and said second region, said third region laterally extending between said first and second thin insulator films, a fourth region formed in said third portion of said substrate so as to contact with said second thin insulator film and to face said third region via said second thin insulator film, said fourth region being isolated from said first, second and third regions by said second thin insulator film, and a fifth region of said one conductivity type formed in said first portion of said substrate and electrically connected to said second region under said fist thin insulator film, said fifth region being electrically isolated from said first region by said first thin insulator film, said first region working as one of a source and a drain of a vertical MOS transistor of one conductivity type channel, said second region working as the other of the source and the drain of said vertical MOS transistor, said fourth region working as the gate of said vertical MOS transistor, and said fifth region serving for electrical connection to said second region.

2. The semiconductor device as claimed in claim 1, in which said first and third portions of said substrate include a first and a second expitaxial layers, respectively, refilling a first and a second trenches formed therein, respectively.

3. The semiconductor device as claimed in claimed 2, wherein said first thin insulator film includes an insulator film formed on one of sidewalls of said first trench and said second thin insulator film includes an insulator film formed on one of sidewalls of said second trench.

4. The semiconductor device as claimed in claim 3, wherein said first and second epitaxial layers are of said one conductivity type and said fourth region has said opposite conductivity type and is formed in said second epitaxial layer.

5. The semiconductor device as claimed in claim 4, further comprising a sixth region of said opposite conductivity type formed in said second epitaxial layer, a gate insulator formed on a part of said second epitaxial layer between said fourth and sixth regions, and a gate electrode formed on said gate insulator, said fourth region, said sixth region and said gate electrode constituting a lateral MOS transistor of the opposite conductivity channel which is isolated from said vertical MOS transistor by said second thin film insulator.

* * * * *